United States Patent

[11] 3,582,947

[72] Inventor Thomas J. Harrison
San Jose, Calif.
[21] Appl. No. 715,812
[22] Filed Mar. 25, 1968
[45] Patented June 1, 1971
[73] Assignee International Business Machines Corporation
Armonk, N.Y.

[54] INTEGRATING RAMP ANALOG TO DIGITAL CONVERTER
10 Claims, 9 Drawing Figs.

[52] U.S. Cl. ........ 340/347
[51] Int. Cl. ........ H03k 13/02
[50] Field of Search ........ 340/347

[56] References Cited

UNITED STATES PATENTS

| | | | |
|---|---|---|---|
| 3,316,547 | 4/1967 | Ammann ........ | 340/347 |
| 3,319,054 | 5/1967 | Kelling ........ | 235/154 |
| 3,462,758 | 8/1969 | Reynal et al. ........ | 340/347 |

*Primary Examiner*—Maynard R. Wilbur
*Assistant Examiner*—Gary R. Edwards
*Attorneys*—Hanifin and Clark and Otto Schmid, Jr.

ABSTRACT: A multiple integrating ramp analog to digital converter is provided wherein an unknown analog input signal is coupled to an integrator for a variable time. The variable time is determined by an integral number of cycles of operation of a counter which is stepped at a predetermined rate while the unknown voltage is being integrated. During this time the output voltage of the integrator goes from an initial level to a second level. When the required time has elapsed, a reference voltage of opposite polarity to the unknown input voltage is coupled to the integrator and the counter is stepped at the predetermined rate. During this time the output voltage of the integrator starts from the second level and, when the initial voltage level appears at the output of the integrator, the counter is stopped and that count then provides a digital representation of tee unknown analog input signal.

INVENTOR.
THOMAS J. HARRISON

BY Otto Schmid, Jr.
ATTORNEY

INTEGRATING RAMP ANALOG TO DIGITAL CONVERTER

CROSS-REFERENCE TO RELATED APPLICATIONS

"Triple Integrating Ramp Analog to Digital Converter" by Hans Bent Aasnaes filed June 27, 1967, Ser. No. 649,161.

BACKGROUND OF THE INVENTION

This invention relates to analog to digital converters and more particularly to analog to digital converters (ADC's) of the multiple integrating ramp type.

There are many applications which require the conversion of an analog signal to digital form and in many of these applications a plurality of analog signals are present representing a wide dynamic range in signal amplitude. To obtain precision in conversion over the dynamic range of the signals in prior art converters, it has been necessary to provide a multirange capability usually by including a gain changing amplifier. The prior art converters suitable for such use are generally expensive due to the complex circuits required. The prior art integrating ramp converters provide low cost for the precision obtained as well as the capability of readily producing a tradeoff of speed vs. resolution. In addition, these converters provide error cancellation and less sensitivity to noise.

It is therefore an object of this invention to provide an improved analog to digital converter of the integrating ramp type having precision of conversion for input signals over a wide dynamic range.

It is another object of this invention to provide an improved multiple integrating ramp ADC having a variable integration time.

It is a further object of this invention to provide an improved multiple integrating ramp ADC having a programmable gain.

It is a further object of this invention to provide an improved multiple integrating ramp ADC having an automatic gain feature.

SUMMARY OF THE INVENTION

Briefly, according to the invention there is provided an integrating ramp analog to digital converter wherein an unknown analog input signal is coupled to an integrating means starting at an initial level for a variable number of cycles of a means for generating digital representations. A reference signal of opposite polarity to the unknown signal is then integrated until the output voltage from the integrating means again reaches its initial level so that the means for generating digital representations then provides a digital representation of the unknown analog signal.

The foregoing and other objects, features and advantages of the invention will be apparent from the following, more particular description of a preferred embodiment of the invention as illustrated in the accompanying drawings.

DESCRIPTION OF PREFERRED EMBODIMENTS

Figures 1, 2:
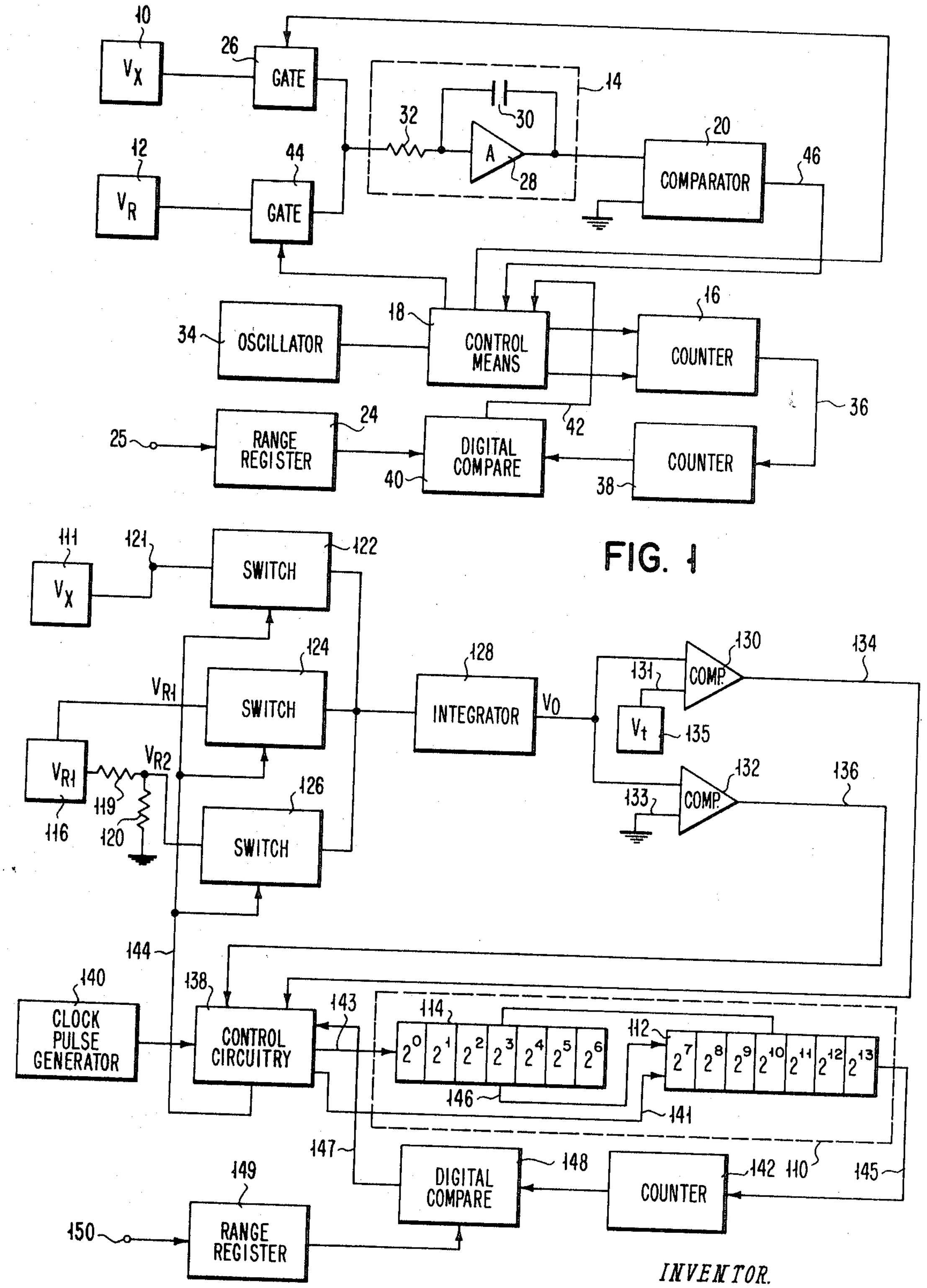
FIG. 1 is a schematic block diagram of a preferred embodiment of a dual-ramp integrating analog to digital converter embodying the invention.
FIG. 2 is a schematic block diagram of a preferred embodiment of a triple-ramp integrating analog to digital converter embodying the invention.
Figure 8:
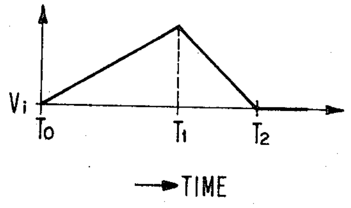
FIG. 8 is a voltage-time diagram showing the ramp voltages generated by the ADC circuits of FIG. 1.

An integrating ramp-type analog to digital converter is shown in the drawings. Referring particularly to FIG. 1, in this ADC an integrating means 14 is connected to an unknown analog voltage source 10 for a length of time determined by a control means 18. A means for generating digital representations of the analog signal is operated while the integrating means is connected to unknown voltage source 10. The unknown voltage source is coupled to integrating means for the time sufficient for the generating means to proceed through a variable number of cycles under control of control means 18. During this time the output voltage of integrating means goes from an initial level to a second level (such as from $T_0$ to $T_1$ in FIG. 8) which depends on the magnitude of the unknown input voltage.

At this time unknown voltage source 10 is disconnected from integrating means 14 and a reference voltage source 12 having a polarity opposite to the unknown voltage source 10 is coupled to integrating means 14. The reference voltage is integrated with the output voltage of the integrating means starting at the second level, and the generating means is stepped at the same rate as before until sensing means 20 detects that the output voltage of integrating means 14 has reached its initial level. At this time the conversion is completed and a digital representation of the magnitude of the unknown analog signal is now in the generating means.

Assuming that the input analog signal is a DC signal, the output of the integrating means is a linear ramp. The value of the ramp after some time T depends upon the magnitude of the input signal and on the time. Thus, if the input signal is integrated for a period NT, the output of the integrator is the same as it would be if the input signal were amplified by a gain of N and only integrated for a time T. An important feature of the analog to digital converter comprising the invention is the provision of a variable integration time for the unknown voltage. Since this is equivalent to variable amplification of the input signal, no amplifier is required in the system.

The variable integration time can be controlled in two ways. In the case where the relative amplitudes of the input signals are known, the gain can be programmed by utilizing the control means to run the generating means through a predetermined number of cycles N. This embodiment for obtaining variable integration time is relatively simple to accomplish, and few additional circuits are required in addition to the normal integrating ramp ADC circuits.

In some cases, it may be desirable to have operation on an automatic gain basis. In this case it is necessary to provide a detector to sense the amplitude of the output voltage of the integrating means at particular instants of time to determine if an additional integration period is required. If at the chosen time the output has not reached a predetermined threshold value, the integration is continued for an additional period of time until a sensing operation indicates that a further period of integration would result in an overload condition.

Embodiments are described below for both the programmed gain and the automatic gain operations applied to a dual-ramp integrating ADC and to a triple-ramp integrating ADC. It is clear from these descriptions that the invention is applicable to any multiple ramp integrating ADC.

In the embodiment of the invention shown in FIG. 1, programmed gain operation is shown for a dual integrating ramp ADC.

A conversion operation is commenced by first storing a gain factor for a particular unknown analog signal from source 10 in range register 24. The gain factor is supplied from a suitable storage means such as in an associated processor in a data processing system to terminal 25. Logic circuits within control means 18 then activate gate 26 to couple the unknown signal to integrating means 14. Integrating means 14 is of conventional construction and in the embodiment shown comprises operational amplifier 28 shunted by capacitor 30 and having series resistor 32 coupled to the input of amplifier 28. Simultaneously with the beginning of integration of the unknown signal, there is started a digital representation generating means comprising oscillator 34 feeding pulses through control means 18 to step counter 16. The count in counter 16 begins at zero at the start of the integration and continues at a rate determined by the oscillator as the unknown signal is being integrated. When counter 16 reaches its capacity, an overflow signal is generated on line 36 and this signal is coupled to a sensing means comprising counter 38, digital compare circuit 40 and range register 24. The overflow signal on line 36 is operable to increment counter 38 by one count, and the status of counter 38 is coupled to a digital compare circuit 40 wherein the count in counter 38 is compared with the count stored in range register 24. In the event that an equal compare results, a signal is generated on line 42 which is coupled to control means 18. In the event that no equal compare results, the integration proceeds through further cycles of counter 16 until an equal compare signal is generated which designates that the designated gain factor has been achieved.

At this time control means 18 is operable to deactivate gate 26 to stop the integration of the unknown signal. At the same time a signal from control means 18 opens gate 44 so that the reference voltage 12 of opposite polarity to the unknown voltage is coupled to the input of integrating means 14. Voltage sensing means 20, comprising a comparator is provided to determine when the output voltage of integrating means 14 reaches the initial or reference level. The reference level is the level existing at the input of the integrating means just prior to the start of integration of the unknown signal. In the embodiment shown, the reference level is essentially ground potential. When the output voltage of integrating means 14 reaches the reference level, a signal generated on line 46 is coupled to control means 18 to deactivate gate 44 and thereby stop the integration of the reference voltage. At this time the gating of oscillator pulses to step counter 16 is also stopped and the count in the counter at this time is a digital representation of the unknown analog voltage.

The apparatus shown in FIG. 2 comprises a programmed gain embodiment of the invention related to a triple integrating ramp ADC. Counter 110 ultimately contains a digital representation of unknown analog voltage $V_x$ shown emanating from a source 111. In this example, binary counter 110 is partitioned into two equal sections. A voltage source 116 generates a first reference voltage $V_{R1}$ and a second reference voltage $V_{R2}$ is derived by means of resistors 119 and 120. A plurality of switches 122, 124, 126 selectively gate voltages $V_x$, $V_{R1}$ and $V_{R2}$ into integrator circuit 128. The output voltage $V_0$ of integrator 128, a ramp voltage, is supplied to comparator circuits 130, 132. The outputs of comparators 130, 132 are provided on lines 134 and 136 respectively to control circuit 138 which, among other functions, gates clock pulses from clock pulse generator 140 into counter groups 112, 114 on lines 141 and 143 respectively. An additional function of control circuitry 138 is to control the operation of switches 122, 124 and 126 by signals on line 144.

The conversion operation starts at a given initial time $T_0$. At time $T_0$ both groups 112 and 114 of counter 110 are in the zero state and switches 124 and 126 are open. Switch 122 is closed by a signal generated by control circuitry 138 on line 144. An unknown analog input voltage $V_x$ applied at terminal 121 is then integrated by integrator 128 for a fixed period of time which for convenience may be equal to the time required to fill counter group 112. Clock pulses from clock pulse generator 140 are gated into counter group 112 by control circuitry 138 on line 141. A signal on line 145 represents an overflow signal for counter group 112. This signal increments counter 142 and the output of counter 142 is compared in digital compare circuit 148 with the value stored in range register 149. The range value was supplied to terminal 150 by a suitable storage means such as an associated data processing machine. The integration is continued until an equal compare signal is generated on line 147.

Figure 5:
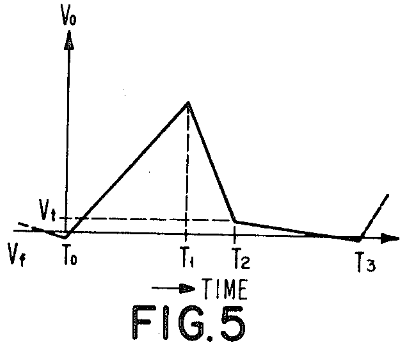
FIG. 5 is a voltage-time diagram showing the ramp voltages generated by the ADC circuits of FIG. 2.

To halt the integration of $V_x$ control circuitry 138 receives the signal on line 147 indicating that group 112 of counter 110 has been filled to capacity the number of times indicated by the predetermined amount stored in range register 149. The signal on line 147 is operative to generate signals on line 144 for opening switch 122 and closing switch 124. The time integral of $V_x$ over the chosen interval is now stored in the integrator circuit 128. This voltage corresponds to the voltage $V_0$ at time $T_1$ in FIG. 5. The remainder of the operation comprises the use of the two reference voltages to complete the conversion so that the digital representation of the unknown analog voltage appears in counter 110. The integration of the two reference voltages produces voltage ramps corresponding to the voltage between times $T_1$ and $T_2$ in FIG. 5 and between times $T_2$ and $T_3$ in FIG. 5, respectively. This operation is conventional in triple integrating ramp ADC's and is fully described in the above-mentioned Aasnaes application.

Figure 3:
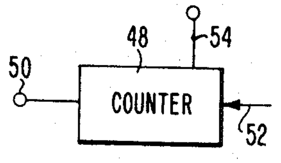
FIG. 3 shows an alternate embodiment of a part of the range select circuit of the analog to digital converters shown in FIGS. 1 and 2.

A simpler circuit applicable to the sensing means for both the dual and triple ramp embodiments shown in FIGS. 1 and 2 respectively is shown in FIG. 3. In this embodiment the range input from an associated data processing machine, for example, is coupled to terminal 50 and stored in counter 48. In this case the complement of the gain number is used. The overflow from the ADC counter is coupled to line 52 to step counter 48. Line 54 is activated when counter 48 reaches zero and a signal on this line terminates the unknown signal integration in the same manner as a signal on line 42 in FIG. 1 or line 147 in FIG. 2.

Figure 4:
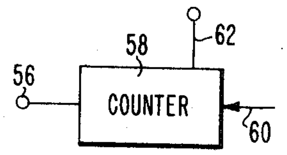
FIG. 4 shows another embodiment of a part of the range select circuit of the analog to digital converters shown in FIGS. 1 and 2.

Another embodiment for the sensing means which is also applicable to both embodiments of the ADC is shown in FIG. 4. In this case the range factor is coupled from a data processing machine, for example, to terminal 56 to load the range factor into countdown counter 58. The overflow signal from the ADC counter is coupled on line 60 to step counter 58 down one step and line 62 senses when the counter reaches zero. This signal then functions in the same manner as a signal on line 42 of FIG. 1 or line 147 of FIG. 2 to end integration of the unknown signal.

Figure 7:
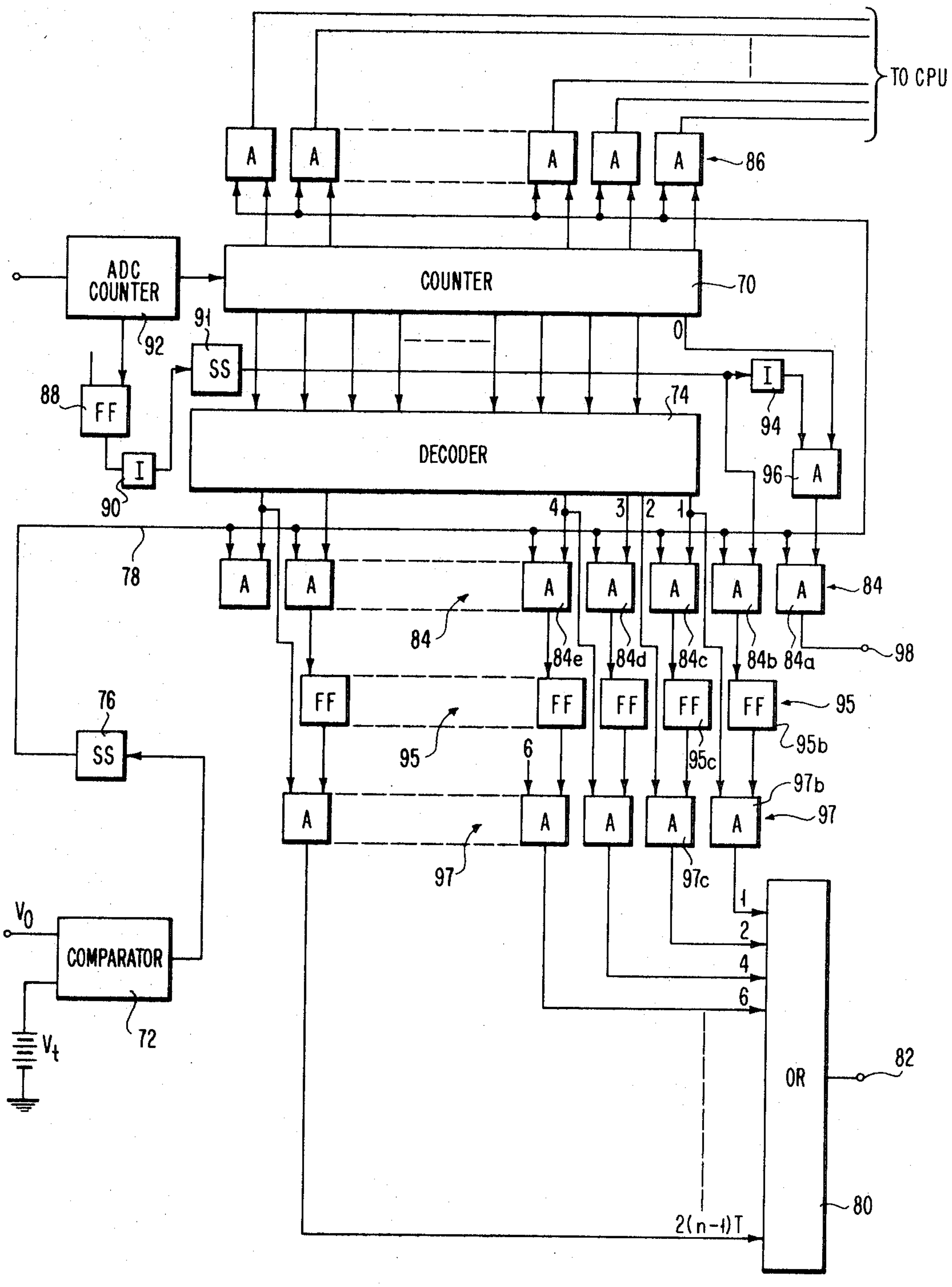
FIG. 7 is a schematic block diagram of the control circuits for an analog to digital converter utilizing the automatic gain embodiment of the invention.

The control circuit for the automatic gain embodiment of the invention is shown in FIG. 7. In this embodiment the overflow signal from the counter associated with the ADC is coupled to a counter 70. The integrator output voltage $V_0$ is also sampled and compared with a reference voltage $V_T$ in compare circuit 72. The digital outputs from counter 70 are coupled to a decode network 74 which converts the count to decimal values. The occurrence of an amplitude of voltage $V_0$ equal to $V_T$ produces a signal from compare circuit 72 which is utilized to start single shot multivibrator 76. As an aid to resolution, the period of single shot multivibrator 76 is chosen to be short. The output of single shot multivibrator 76 is coupled on line 78 to a plurality of AND circuits 84. Depending on the count in counter 70 at that time, one of the AND circuits 84 is energized and a signal is coupled through flip-flop 95, AND circuit 97 and OR circuit 80 to produce a signal on line 82 to stop the integration. The signal on line 82 is utilized as a reset signal for the counters and flip-flops. One or more of AND circuits 86 are energized to produce a digital representation of the gain factor which is coupled back to the control means such as a central processing unit of a data processing system.

Figure 6:
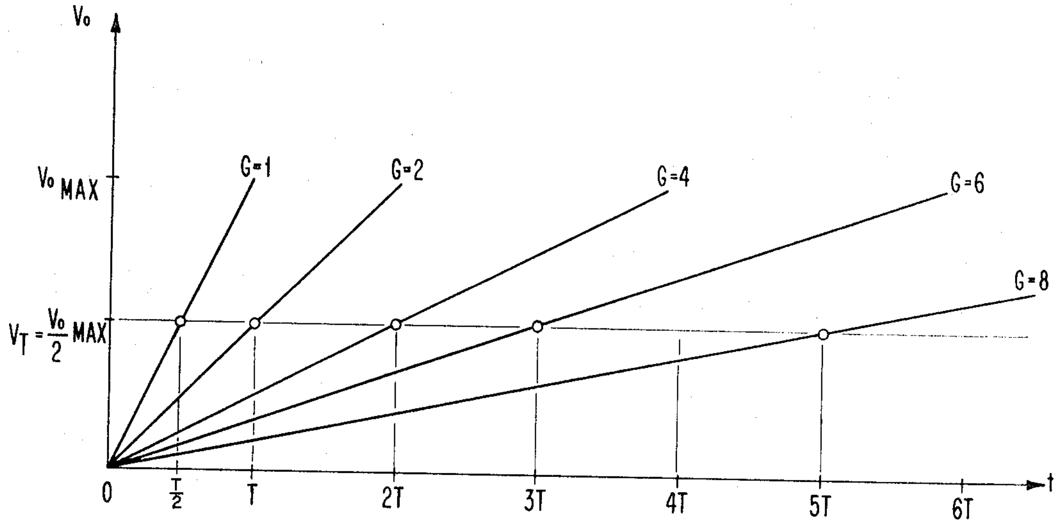
FIG. 6 is a voltage-time diagram useful in explaining the automatic gain embodiment of the invention shown in FIG. 7.

A diagram showing the output of the integrator during the integration of the unknown for gains of 1, 2, 4, 6, . . . . and full scale inputs is shown in FIG. 6.

The gains 1, 2, 4, 6, . . . . selected for this example result in the simplest gain control logic. Other gains can be provided in a similar manner. Integer gains of 1, 2, 4, 6, . . . . are preferable since the integration interval is then an integer multiple of T which is easily detected by monitoring the overflow pulses from the counter. Noninteger gains can be provided with an appropriate decoding network coupled to the counter.

A control circuit for the case in which reference voltage $V_T$ is $V_{0max}/2$ is shown in FIG. 7. It is note by reference to FIG. 6 that the occurrence of the compare signal before the ADC counter reaches half-capacity (at time T/2) results in an overflow. The overflow sensing means in the circuit comprises an output from the ADC counter 92 when it reaches half-capacity which is coupled to reset flip-flop 88 to the OFF condition. Flip-flop 88 is set ON in response to the reset pulse on line 82. The output of flip-flop 88 is coupled through invertor 90 to start single shot multivibrator 91. The output of single-shot multivibrator extends for one-half an ADC counter period and this output is coupled through inverter 94 to AND circuit 96 and to AND circuit *b*. The zero output line of counter 70 is also coupled to AND circuit 96 to condition this circuit when single-shot 91 is not on. In the event that an equal compare signal is generated on line 78 during this time, AND circuit **84*a* is conditioned to produce an overflow signal at terminal 98. When an equal compare is generated between one-half and one cycle of operation of ADC counter 92, AND circuit 84*b* is conditioned to set flip-flop 95*b*. When the one output line of the decoder is then active AND circuit 97*b* is conditioned to stop the integration at the end of the first cycle. Likewise if the equal compare occurs between one and two cycles, AND circuit 84*c* is conditioned to set flip-flop 95*c* and AND circuit 97*c* is then conditioned at two cycles to terminate the integration. The circuits to detect other ranges work in a similar manner with AND circuits 84, flip-flops 95 and AND circuits 97** being provided for each range to be detected. A chart showing the control algorithm implemented in FIG. 7 for $V_T=\frac{1}{2}V_{0max}$ is shown below where $V_0$= integrator output voltage and $V_{0max}$= max $V_0$ which occurs for full-scale input on any range.

| Time *t* | T | 2T | 3T | 4T | . . . | $nT(n>2)$ |
|---|---|---|---|---|---|---|
| If comp. fired | Integrate only to T | Integrate only to 2T | Integrate only to 4T | Integrate only 6T | . . . | Integrate only to 2 (n-1)T. |
| If comp. not fired | Integrate at least to 2T | Integrate at least to 4T | Integrate at least to 6T | Integrate at least to 8T | . . . | Integrate at least to 2nT. |

Figure 9:
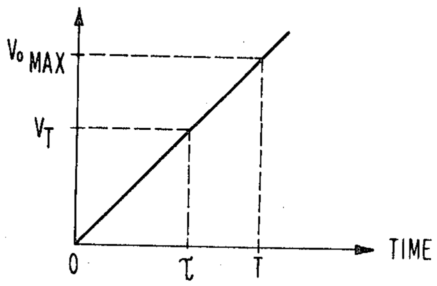
FIG. 9 is a voltage-time diagram showing the relationship between the threshold voltage and the integrator output voltage for the automatic gain embodiment of the ADC shown in FIG. 7.

If $V_T\neq\frac{1}{2}V_{0max}$, the top line of the table (Time $t$) need only be altered by substituting the time at which a full scale input on $G=1$ intersects the comparator threshold. For example, if $V_T=\frac{1}{4}V_{0max}$ substitute $T/2$ for $T$. In general, for $V_T=\frac{V_{0max}}{2^p}$ substitute $T/2^{p-1}$ for $T$. In these cases, a comparison may not be made at every multiple of the basic time period; for example, when using $V_T=\frac{V_{0max}}{4}$ comparisons are made at $T/4$, $T/2$, $T$, $3T/2$, $5T/2$, . . . corresponding to gains of $G=1, 2, 4, 6, 8, \ldots$ For any other $V_T$, the time can be found from the diagram shown as FIG. 9. The equation for the line is $V_{0max}(t/T)$. The equation for the intercept is $V_T\frac{V_{0max}}{T}\tau$ or $\tau=V_tT/V_{0max}$ where $\tau$ is the time to be substituted for $T$ in the first line of the algorithm.

The condition $V_T>\frac{V_{0max}}{2}$ is not acceptable if a gain $G=1$ is required since the decision to stop integrating at $t=T$ must be made before t me $T$.

To provide maximum precision over the range of amplitudes of unknown voltage, it is desirable that the unknown signal be integrated for the maximum time without generating an overload condition. This means that low level signals are integrated for a number of cycles of the ADC counter. This produces a disadvantage in that the conversion speed varies with the level of the input signal; however, the same factor also provides an advantage. Since the lower range signals are integrated for a longer period of time and integration is a form of averaging or filtering, the low level range has a lower effective bandwidth. Since the low level signals generally have a lower signal to noise ratio, the additional filtering action is beneficial in terms of repeatability of measurement.

Thus, it can be seen that there is provided the capability of a wide dynamic-multiranged system without the requirement for amplifiers. For example, a particular system may include inputs from thermocouples having a magnitude from 0 to 60 millivolts. The same system may have inputs from thermal converters having a magnitude from 0 to 120 millivolts. An ADC embodying the applicant's invention can be used to get maximum resolution for all of these signals by providing operation equivalent to gains of say 4, 2, and 1 for 30, 60 and 120 millivolts.

While the invention has been particularly shown and described with reference to a preferred embodiment thereof, it will be understood by those skilled in the art that various changes in the form and details may be made therein without departing from the spirit and scope of the invention.

What I claim is:

1. In a analog to digital converter, the combination comprising:

- means for receiving said analog signal of unknown magnitude;
- reference signal-generating means for generating a reference signal of known magnitude;
- integrating means responsive to said analog signal-generating means and to said reference signal-generating means for selectively integrating said analog signal and said reference signal;
- indicating means for producing an output indicative of the time that has elapsed since initiation of integration of said analog signal;
- means for generating a signal corresponding to a selected range of integration time;
- comparator means responsive to said range selecting signal for producing an output signal whenever the output of said indicating means indicates that an integration time corresponding to said range signal has elapsed; and control means responsive to said comparator means output for decoupling said unknown signal and for coupling said reference signal to said integrating means.

2. A device as set forth in claim 1 wherein sequential gains of said integrator circuit correspond to predefined sequential segments of integrator time, and

- wherein said range selecting means includes means for establishing a threshold level, and
- said comparator means includes logic circuit means responsive to the analog signal integrator output attaining said threshold level for causing said comparator means output signal to be produced at the end of the said sequential time segment during which said threshold attainment occurs.

3. In a analog to digital converter for producing a digital representation of the magnitude of an analog signal of unknown magnitude, the combination comprising:

- means for receiving said analog signal of unknown magnitude;
- reference signal-generating means for generating a reference signal of known magnitude;
- integrating means responsive to said analog signal-generating means and to said reference signal-generating means for selectively integrating said analog signal and said reference signal;
- means responsive to said integrating means for generating a signal indicative of the elapsed time of the integration of said analog signal;
- storage means;
- means for loading said storage means with a signal corresponding to a selected integration time;

means for sensing the contents of said storage means and said elapsed time indicating signal for producing a signal when a comparison exists therebetween;

control means responsive to said sensing means signal for coupling said reference signal to said integrating means.

4. A device as set forth in claim 3 wherein said elapsed time indicating means comprises a counter and means for selectively gating a series of pulses to said counter.

5. A device as set forth in claim 4 wherein said storage means is a digital register; and said sensing means produces said output signal whenever at least a portion of said counter contains a count corresponding to the contents of said digital register.

6. A device as set forth in claim 1 wherein said comparator means includes a counter coupled for storing said range selecting signal, means for coupling count pulses to said counter during integration of said analog signal, and means for producing said comparator means output signal whenever the content said counter reaches a preselected level.

7. A device as set forth in claim 6 wherein said count pulses decrement said counter; and means for sensing when the count in said counter reaches zero.

8. In a analog to digital converter for producing a digital representation of the magnitude of an analog signal of unknown magnitude the combination comprising:

means for receiving said analog signal of unknown magnitude;

reference signal-generating means for generating a reference signal of known magnitude;

integrating means responsive to said analog signal-generating means and to said reference signal-generating means for selectively integrating said analog signal and said said reference signal;

pulse-producing means;

means responsive to said integrating means for counting pulses from said pulse-producing means and for producing a multiplicity of carry signals during integration of said analog signal;

means for generating a signal corresponding to selected range of time of integration of said analog signal;

sensing means for producing an output whenever a number of said carry signals has occurred corresponding to said range signal; and control means responsive to said sensing means output for stopping the integration of said analog signal and coupling said reference signal to said integrating means.

9. A device as set forth in claim 8 wherein said means for sensing the integration of said analog signal comprises:

means for detecting when the output of said integrating means reaches a threshold level; and means responsive to said detecting means and said carry signals for selectively determining the remaining length of time of integration before producing the output signal for said control means.

10. A device as set forth in claim 9 which further includes:

means responsive to said pulse-producing means and said remaining integration time determining means for storing a digital count corresponding to the length of time said analog signal was integrated.